United States Patent [19]
Katagiri et al.

[11] Patent Number: 5,457,076
[45] Date of Patent: Oct. 10, 1995

[54] MICROWAVE DIELECTRIC CERAMIC COMPOSITION AND PREPARING METHOD THEREOF

[75] Inventors: Hiroshi Katagiri; Hirofumi Ozeki, both of Aichi, Japan

[73] Assignee: NGK Spark Plug Co., Ltd., Japan

[21] Appl. No.: 292,777

[22] Filed: Aug. 18, 1994

[30] Foreign Application Priority Data

Aug. 19, 1993 [JP] Japan .................. 5-228012

[51] Int. Cl.⁶ .................. C04B 35/26; C04B 35/46
[52] U.S. Cl. .................. 501/35
[58] Field of Search .................. 501/135

[56] References Cited

U.S. PATENT DOCUMENTS 4,621,067 11/1986 Kitoh et al. .................. 501/135

FOREIGN PATENT DOCUMENTS

| 0257653 | 3/1988 | European Pat. Off. ........ C04B 35/46 |
| 50-34759 | 11/1975 | Japan .................. 501/135 |
| 52-118599 | 10/1977 | Japan . |
| 53-60541 | 5/1978 | Japan .................. 501/135 |
| 02-129065 | 5/1990 | Japan . |

OTHER PUBLICATIONS

Derwent Abstract—Jap. 52-118599 (Oct./1977).
Derwent Abstract—Jap. 2-129065 (May/1990).
Chem. Abstracts 88:114249—Jap. 52-118599 (Oct. 1977).
Chem. Abstracts 113:203301—Jap. 2-129065 (May 1990).

*Primary Examiner*—David Brunsman
*Attorney, Agent, or Firm*—Finnegan, Henderson, Farabow, Garrett and Dunner

[57] ABSTRACT

A ceramic composition having a high value $\epsilon r$ while maintaining Qu and $\tau f$ each in a range of practical characteristic. The present invention is applicable to dielectric resonators and impedance matching of various kinds of microwave circuits. The ceramic composition comprises $Ba_{1-x}Sr_x(Zn_{1/3}Nb_{2/3})O_3$ (in which $0.6 \leq x \leq 1.0$) as the main ingredient, to which $TiO_2$ is incorporated by 0.01 to 1 parts by weight based on 100 parts by weight of the main ingredient. The ceramic composition may have a Qu value of 2000 to 2900 (at 4.5 GHz), relative dielectric constant of 39 to 42, and a temperature constant of resonance frequency ($\tau f$) in the range of $-8$ to $+10$ ppm/°C. The ceramic composition may not contain $Sr_5Nb_4O_{15}$ or $Ba_4Nb_2O_9$. It may index for the regularity of the B site ingredient of $7-9\times10^{-2}$. The ceramic composition may be prepared by calcination, sintering, and an annealing treatment after sintering. A calcination atmosphere and a sintering atmosphere may be ZnO atmosphere.

18 Claims, 9 Drawing Sheets

$Ba_{1-x}Sr_x(Zn_{1/3}Nb_{2/3})O_3$ $Ba_{1-x}Sr_x(Zn_{1/3}Nb_{2/3})O_3$ $Ba_{1-x}Sr_x(Zn_{1/3}Nb_{2/3})O_3$ $Ba_{1-x}Sr_x(Zn_{1/3}Nb_{2/3})O_3$

Fig. 6 $[Ba_{0.2}Sr_{0.8}(Zn_{1/3}Nb_{2/3})O_3 + 0 \sim 1.0 wt\% TiO_2]$ ceramic composition Fig. 7 [Ba$_{0.2}$Sr$_{0.8}$(Zn$_{1/3}$Nb$_{2/3}$)O$_3$+0~1.0wt%TiO$_2$]ceramic composition

# MICROWAVE DIELECTRIC CERAMIC COMPOSITION AND PREPARING METHOD THEREOF

BACKGROUND OF THE INVENTION

The present invention concerns a microwave dielectric ceramic composition and, more specifically, it relates to a microwave dielectric ceramic composition having a high relative dielectric constant (hereinafter referred to as "$\epsilon r$") while maintaining non-lead Q factor (hereinafter referred to as "Qu") and temperature coefficient of resonance frequency (hereinafter referred to as "$\tau f$") each in a range of practical characteristic, as well as preparing method therefor.

The present invention is applicable, for example, to dielectric resonators in a microwave, microwave integrated circuit substrates and impedance matching of various kinds of microwave circuits.

Since the microwave dielectric ceramic composition (hereinafter referred to as a "ceramic composition") has a dielectric loss tending to increase as the working frequency becomes higher, it has been desired for a ceramic composition of large Qu in a microwave frequency region.

As dielectric ceramic materials in the prior art, there have been known, for example, a ceramic composition in which a crystal structure has two phases of a perovskite phase and an ilumenite phase (Japanese Patent Laid-Open Hei 2-129065) and a ceramic composition comprising $MgTiO_3$ and $TiO_2$ incorporated with a predetermined amount of $CaTiO_3$ (Japanese Patent Laid-Open Sho 52-118599).

However, the former ceramic composition contain other ingredients such as $Nd_2O_3$, PbO and ZnO in a great amount and, in addition, the value for Qu is not always high. The latter ceramic composition involves a problem that $\tau f$ varies greatly as from +87 to −100 ppm/°C. in a mixing range of $CaTiO_3$ from 3 to 10% by weight and it is difficult to control it to a smaller value nearly equal to zero.

SUMMARY OF THE INVENTION

An object of the present invention is to overcome the foregoing problems and provide a ceramic composition having a high value $\epsilon r$ while maintaining Qu and $\tau f$ each in a range of practical characteristic, as well as a method of preparing the same.

The ceramic composition according to the first aspect of the present invention comprises a composition represented by: $Ba_{1-x}Sr_x(Zn_{1/3}Nb_{2/3})O_3$ ($0.6 \leq x \leq 1.0$) as a main ingredient in which $TiO_2$ is added and incorporated by from 0.01 to 1 parts by weight based on 100 parts by weight of the $Ba_{1-x}Sr_x(Zn_{1/3}Nb_{2/3})O_3$ (hereinafter represented as "% by weight").

A method of preparing a ceramic composition according to a second aspect of the present invention for forming $Ba_{1-x}Sr_x(Zn_{1/3}Nb_{2/3})O_3$ ($0.6 \leq x \leq 1.0$) as the main ingredients comprises applying two steps to calcination for two steps and, subsequently, applying sintering.

A method of preparing a ceramic composition according to the third aspect of the present invention comprises applying calcination for more than 15 hours and, subsequently, applying sintering.

Further, a method of preparing a ceramic composition according to the fourth aspect of the present invention comprises applying an annealing treatment after sintering.

As described above according to the present invention, it is possible to obtain a dielectric ceramic composition having $\tau f$ at a value within a preferred range while maintaining Qu and $\epsilon r$ in a range of practical (high) characteristic.

DETAILED DESCRIPTION OF THE INVENTION

Figure 1:
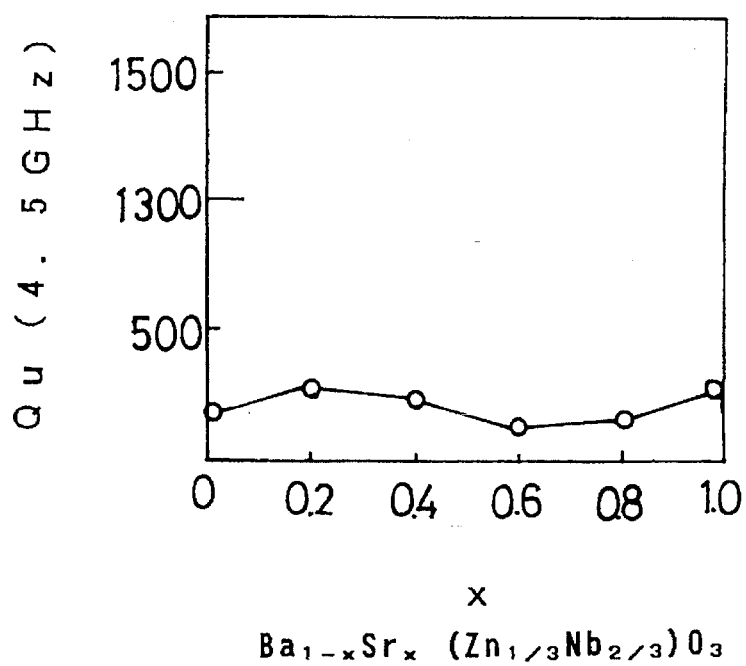
FIG. 1 is a graph representing a relationship between x and Qu in a $Ba_{1-x}Sr_x(Zn_{1/3}Nb_{2/3})O_3$ ceramic composition.
Figure 2:
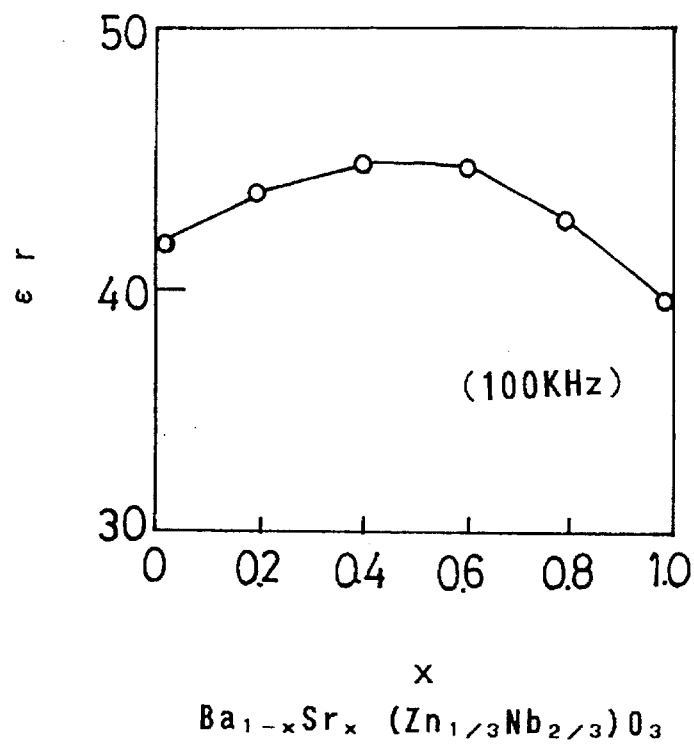
FIG. 2 is a graph showing a relationship between x and $\epsilon r$ in the ceramic composition shown in FIG. 1.
Figure 3:
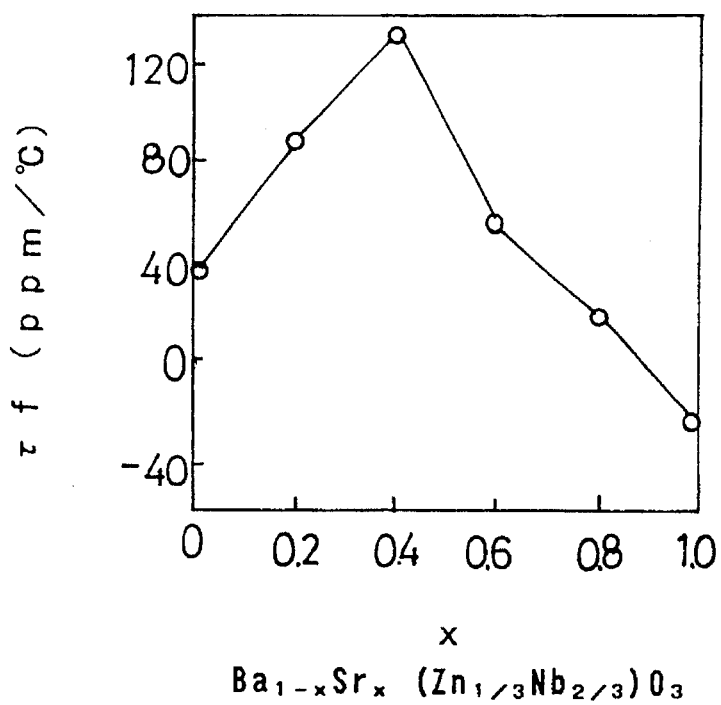
FIG. 3 is a graph showing a relationship between x and $\tau f$ in the ceramic composition shown in FIG. 1
Figure 4:
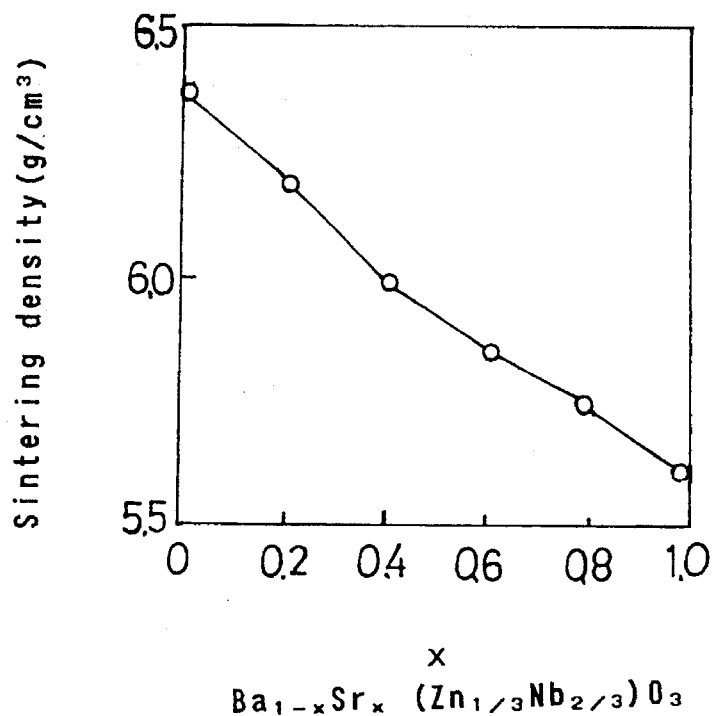
FIG. 4 is a graph showing a relation between x and sintering density.

In the present invention, the range for "x" is defined as described above, because $\tau f$ takes a value in a narrow range near 0 ppm/°C. if x is not less than 0.6 which is preferred. Further, it is particularly preferred that x is around 0.9 if a high Qu value is desired.

Further, "$TiO_2$" is added as described above by the reasons specified below. It is considered that a $Ba(Zn_{1/3}Nb_{2/3})O_3$–$Sr(Zn_{1/3}Nb_{2/3})O_3$ type dielectric material generally forms a super lattice structure by regular arrangement of the B site ingredient ($Zn^{2+}$, $Nb^{5+}$) to improve the Qu value, as well as that addition of $TiO_2$ can provide an effect of promoting the regular arrangement described above. The effect of $TiO_2$ as described above is attributable to that (1) $TiO_2$ has an effect of promoting sintering reaction and (2) the ionic radius of "$Ti^{4+}$" (about 0.68 Å) of $TiO_2$ is slightly smaller than the ionic radius of "$Zn^{2+}$" (about 0.71 Å) and ionic radius of "$Nb^{5+}$" (about 0.69 Å) in the ceramic composition, to facilitate the regular arrangement of the B site ingredient.

Further, the addition amount of "$TiO_2$" is defined as described above, because the regular arrangement does not progress so much if it is less than 0.01% by weight, so that the Qu value is scarcely improved, whereas the addition effect is saturated at about 1% by weight and no further improvement can be expected for the Qu value by the addition of a greater value, as well as the value εr is reduced or the value τf Lakes a large negative value, which is not preferred.

As shown in the second aspect of the present invention, sintering is applied for two steps, in order to make the reactivity of the A site ingredient and the B site ingredient uniform.

As shown in the third aspect of the present invention, calcination is applied for a long period of time, in order to improve the reactivity to facilitate the formation of the main ingredient, thereby promoting the regularization of the B site ingredient. The calcination time is preferably more than 20 hours (particularly, more than 24 hours).

As shown in the fourth aspect of the present invention, the annealing treatment is applied in order to make the values for Qu, εr and τf appropriate by promoting the regularization of the B site ingredient and controlling fluctuation in the valence number of cations.

EXAMPLES

Descriptions will be made more specifically to the present invention referring to examples (test examples).

(1) Example 1

In this example, the composition of the ceramic composition was studied (Test Example 1) and the effect of $TiO_2$ addition on the Qu value or the like (Test Example 2) was examined.

(i) Test Example 1

In this test example, $BaCO_3$ powder (purity: 99.9%), $SrCO_3$ powder (purity: 98.7%), ZnO powder (purity: 99.5%) and $Nb_2O_5$ powder (purity: 99.9%) were used as the starting material, and they were properly admixed to prepare six kinds of formulated powder represented by a compositional formula $Ba_{1-x}Sr_x(Zn_{1/3}Nb_{2/3})O_3$ in which the value "x" is different, each weighed by a predetermined amount (650–700 g). The value for "x" in each of the formulated powders was 0, 0.2, 0.4, 0.6, 0.8 and 1.0.

Then, each formulated powder was put to primary pulverization in a vibration mill (aluminum ball of 20 mmφ) for three hours.

Then, calcification was applied in an atmospheric air at a temperature of 1300° C. for 2 hours. The temperature elevation rate was 200° C. and the temperature lowering rate was −200° C./h in this case.

Then, 29 g of a predetermined organic binder and 300 to 330 g of water were added to the calcined powder and put to secondary pulverization by a ball mill (aluminum ball of 20 mmφ, number of rotation: 90 rpm) for 23 hours.

Subsequently, the powder was pelletized by vacuum freeze-drying (vacuum degree; about 0.4 Torr, vacuum drying time: about 20 hours, freezing temperature; −20°~−40° C. drying temperature: 40°–50° C.), and the pelletized starting material was molded of 1000 kg/cm² into a cylindrical shape of 19 mmφ×10 mmt (thickness).

Then, the molding product was degreased in an atmospheric air at 500° C. for 3 hours, subsequently, sintered at a temperature of 1550° C. for 12 hours and, finally, polished at both end faces into a cylindrical shape of about 16 mmφ×8 mint (thickness), to form dielectric specimens. The temperature elevation rate was 50° C./h and the temperature lowering rate was −50° C./h in the sintering step.

Then, for each of the specimens, values εr, Qu and Yf were measured, for example, by a parallel plate conductor type dielectric columnar resonator method ($TE_{011}$ MODE) and the sintering density was measured by an Archimedes method. The measuring frequency was from 4.2 GHz to 4.5 GHz, and the value converted to that at 4.5 GHz was shown. τf was measured in a temperature range of 30° C. to 80° C. and calculated as: $\tau f=(f_{80}-f_{30})/(f_{30}\times\Delta T)$ and $\Delta T=80°-30°=50°$ C. The value εr, Qu, τf and sintering density were measured by the same methods also in each of test examples (Test Examples 2–5) shown below.

FIGS. 1–4 show the result of this test example.

From the foregoing result, τf takes a value within a range from 36.3 to 128.0 ppm/°C. for each of the specimens with the value of "x" of less than 0.6, where as τf is adjusted to a range of about −25.5 to +65.7 ppm/°C. (a narrow range around 0 ppm/°C.) for each of the specimens with the value for "x" of 0.6 to 1. The value "x" of about 0.9 is particularly preferred since the value Qu is high and the value τf is around 0 ppm/°C.

Further, if the value "x" exceeds 0.5, εr tends to decrease but this may be considered as within an allowable range.

On the other hand, in this test example, no desired value Qu is obtained for any of values "x" (lower by more than 50% below the aimed value) and it is not satisfactory. Therefore, a further study was made in Test Example 2 to be described later in this example.

(ii) Test Example 2

In this test example, dielectric specimens were manufactured substantially in the same method as in Test Example 1 from formulated powder prepared by using the starting material comprising, for example, the $BaCO_3$ powder and the $SrCO_3$ powder described in Test Example 1 and containing $TiO_2$ (purity: 99.98%) added as a sintering aid by a predetermined amount (for five kinds of addition amount of 0.01, 0.05, 0.1, 0.5, 0.75 and 1% by weight). However, only the formulated powder having the main ingredient of the compositional formula represented by $Ba_{0.2}Sr_{0.8}(Zn_{1/3}Nb_{2/3})O_3$ (in which "x" is 0.8) was used in this test.

Further, manufacture for the dielectric specimens was tried in this test example for three types of sintering temperature at 1500° C., 1525° C. and 1550° C.

Measurement was made for εr, Qu and τf for the dielectric specimens prepared as described above and the results are shown FIGS. 5 to 7.

Figure 5:
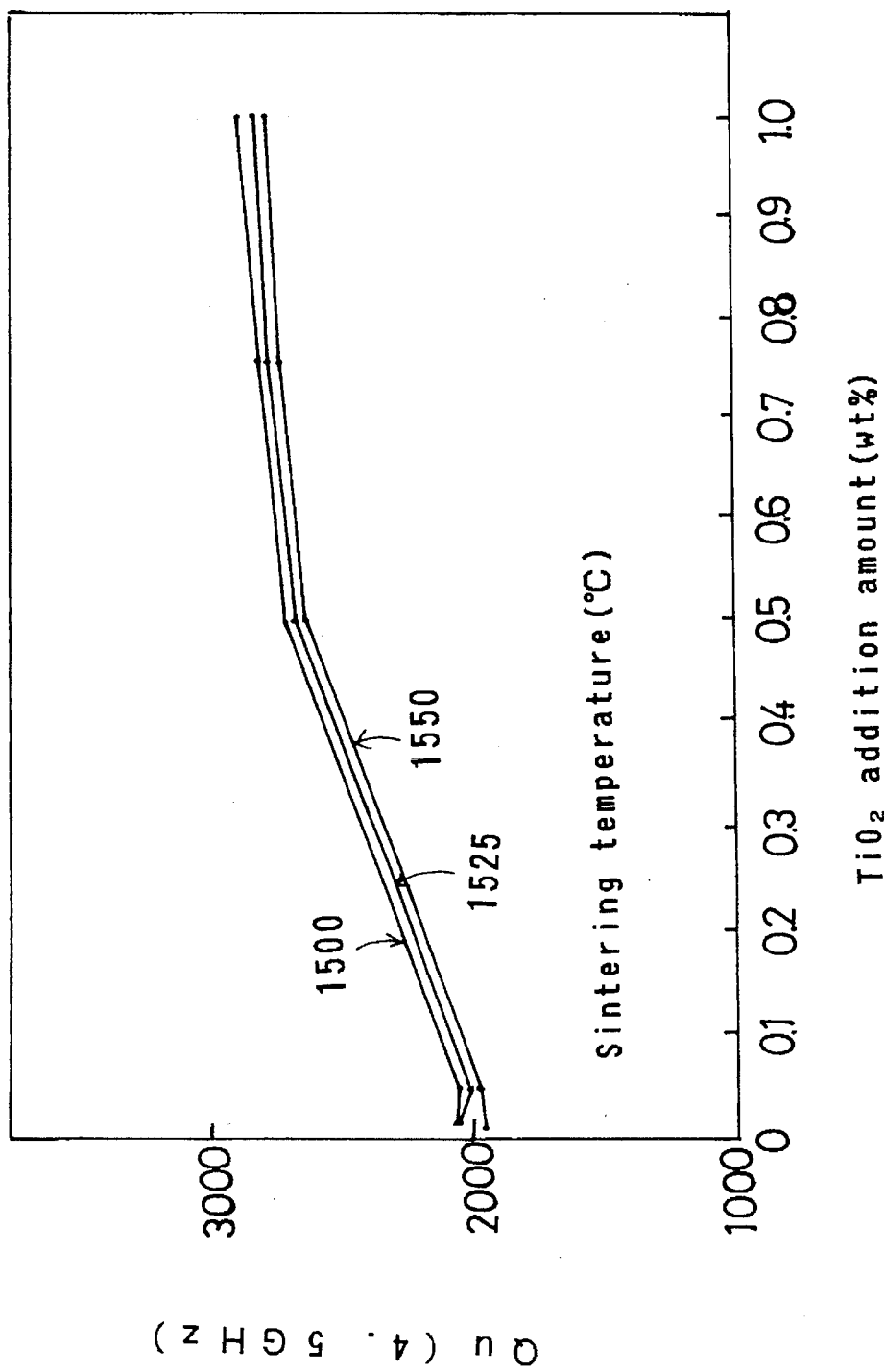
FIG. 5 is a graph showing a relationship between the addition amount of $TiO_2$ and Qu (on every sintering temperature) in a $Ba_{1-x}Sr_x(Zn_{1/3}Nb_{2/3})O_3+(0–1.0)$ wt % $TiO_2$) ceramic composition.

As shown in FIG. 5, the value Qu increased along with increase of the addition amount of $TiO_2$. It is considered to be attributable to the promotion for the regular arrangement of the B site ingredient in accordance with the addition of $TiO_2$.

However, as the addition amount of $TiO_2$ approached 1% by weight, the increasing rate for the value Qu was reduced due to saturation. Further, if the addition amount was less than 0.1% by weight, it scarcely provided increasing effect for the value Qu.

Figure 6:
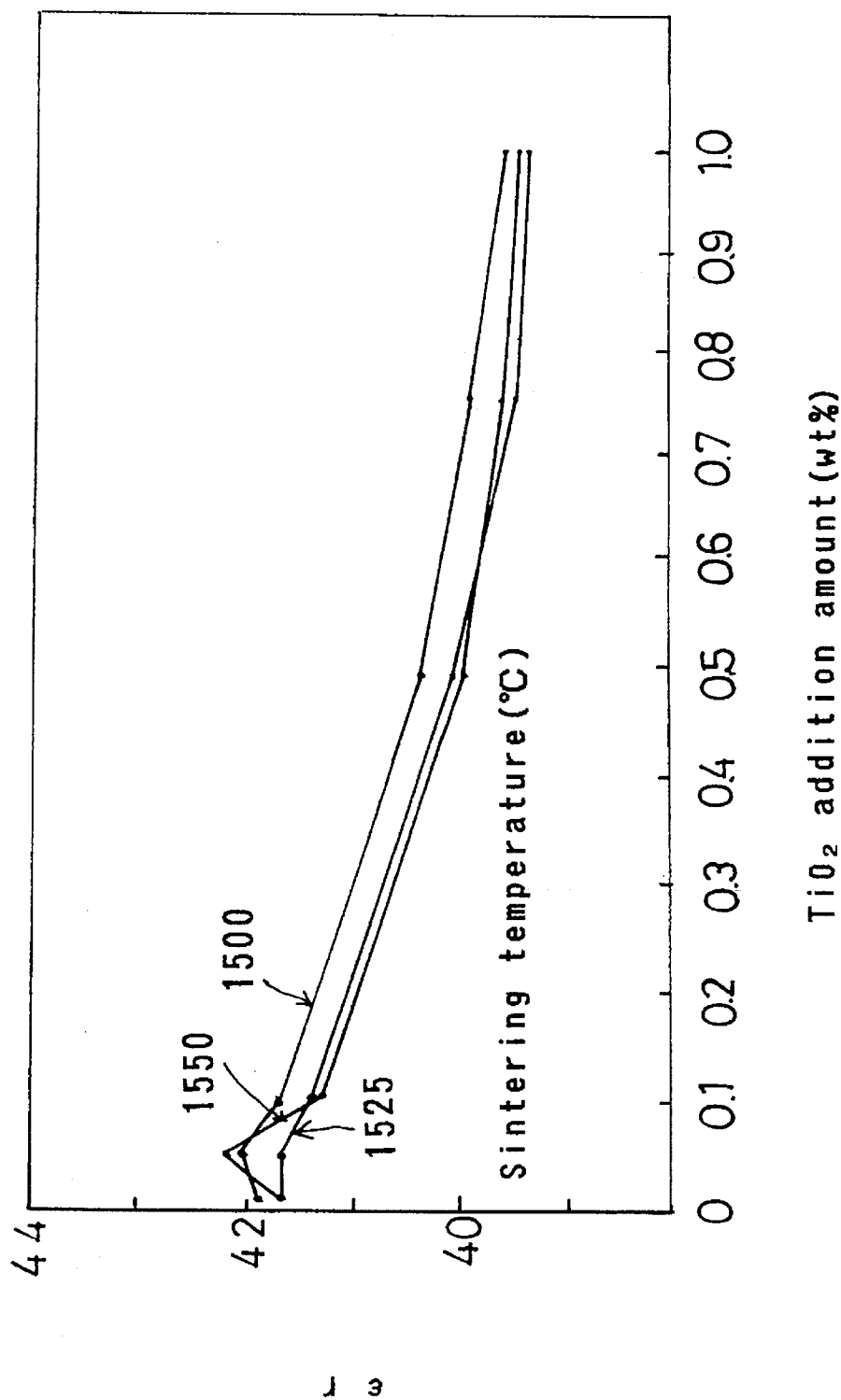
FIG. 6 is a graph showing a relationship between the addition amount of $TiO_2$ and $\epsilon r$ (on every sintering temperature) for the ceramic composition shown in FIG. 5.

Further, as can be seen from FIG. 6, the value $\epsilon r$ tended to decrease along with increase for the addition amount of $TiO_2$ but this is within an allowable range. Further, the value $\tau f$ shown in FIG. 7 decreased moderately along with increase of the addition amount of $TiO_2$ and a particularly preferred value around 0 ppm/°C. was shown if the addition amount was about 0.4% by weight.

Figure 7:
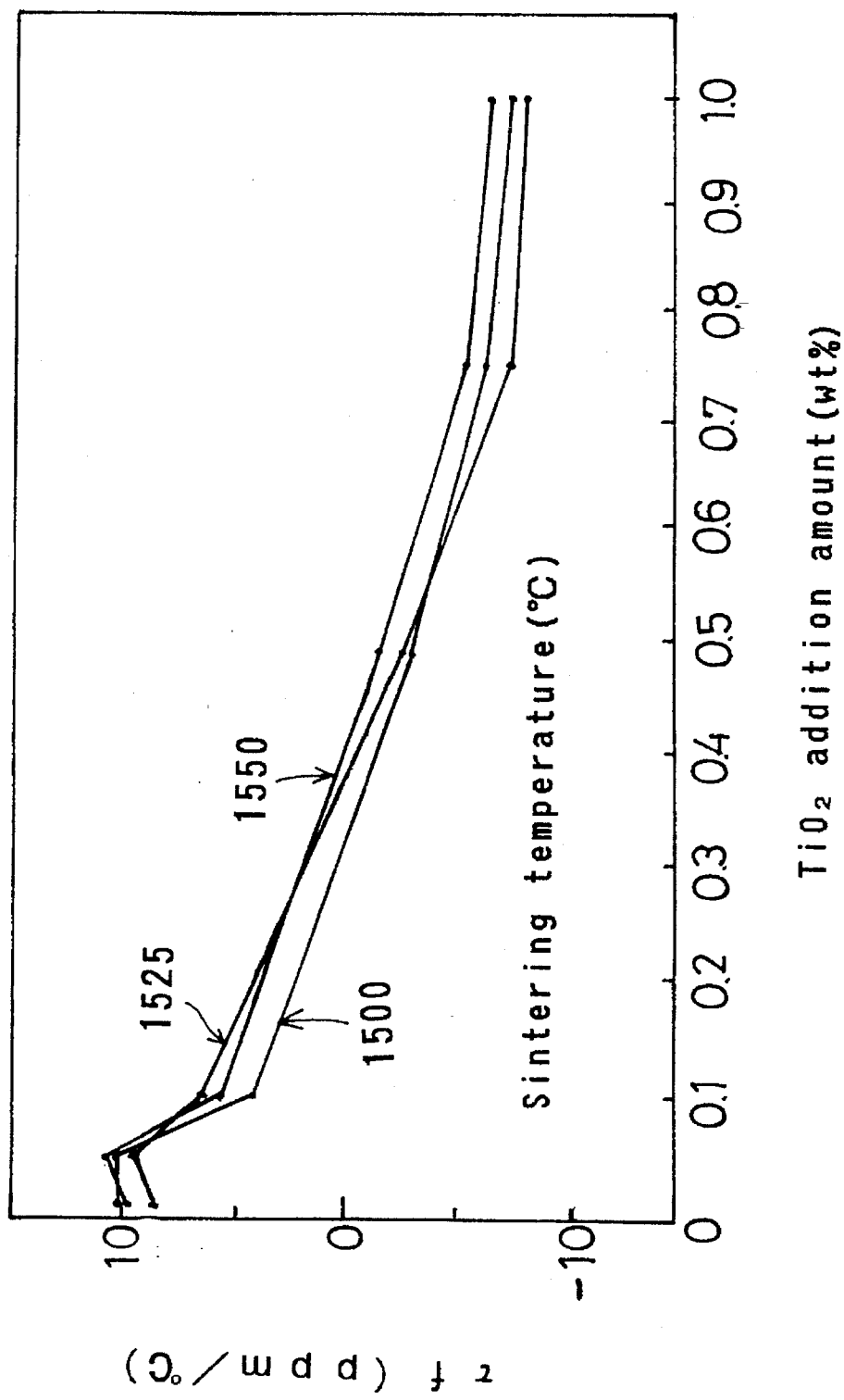
FIG. 7 is a graph showing a relationship between the addition amount of $TiO_2$ and $\tau f$ (on every sintering temperature) for the ceramic composition shown in FIG. 5.

In any of the cases shown in FIGS. 5 to 7, more preferred value is shown as the sintering temperature is lowered. This is considered to be attributable, for example, to that the sintering temperature could be lowered with addition of $TiO_2$ as the sintering aid and, as a result, densification of the dielectric specimen was promoted and evaporation of ZnO in the main ingredient was suppressed or the like.

(iii) Effect of Example 1

According to the Test Examples 1 and 2 described above, the dielectric specimens prepared from the formulated powders comprising the composition represented by $Ba_{1-x}Sr_x(Zn_{1/3}Nb_{2/3})O_3$ ($0.6 \leq x \leq 1.0$) as the main ingredient to which $TiO_2$ is added by 0.01 to 1% by weight show satisfactory values for Qu, $\tau f$ and $\epsilon r$.

(2) Example 2

In this example, effects of improvement for the calcination step and the annealing treatment after sintering on the values Qu, etc. were examined.

(i) Test Example 3

In this test example, effects of the calcination method and absence or presence of the annealing treatment after the sintering step on the value Qu, etc. were examined upon preparing the dielectric specimens using the formulated powder not containing $TiO_2$.

In this test example, Nos. 1 to 10 dielectric specimens were formed in the same manner as in Test Example 1 except for changing "calcination condition", "sintering condition" or the like as shown in Table 1. The formulated powder used in this example are only those in which the compositional formula of the main ingredient is represented by $Ba_{0.2}Sr_{0.8}(Zn_{1/3}Nb_{2/3})O_3$ ("x" is 0.8).

The value $\epsilon r$, Qu, $\tau f$ and sintering density were measured also for the dielectric specimens formed as described above and the results are shown in Table 1. Numerical values for the dielectric specimens formed under the same conditions as those in Test Example 1 are also shown for the comparison in the table (No. 1 and No. 3)

In Nos. 4 to 7 shown in Table 1, the calcination step was conducted by two stages including a first calcination step and a second calcination step (hereinafter

TABLE 1

| No. | Calcination condition | Sintering condition | Annealing treatment | Qu (4.5 GHz) | $\epsilon_r$ | $\tau_f$ (ppm/°C.) | Sintering density (g/cm³) | S ($\times 10^{-2}$) |
|---|---|---|---|---|---|---|---|---|
| 1 | 1300° C. × 2 h | 1550° C. × 12 h | Absence | 1732 | 42.5 | 15.1 | 5.76 | 0 |
| 2 | 1300° C. × 2 h | 1550° C. × 12 h | 1300° C. × 12 h | 1913 | 41.8 | 7.68 | 5.76 | — |
| 3 | 1300° C. × 2 h | 1550° C. × 48 h | Absence | 1662 | 42.5 | 18.4 | 5.74 | 0 |
| 4 | 1000° C. × 2 h 1300° C. × 24 h | 1500° C. × 12 h | Absence | 1946 | 41.4 | 8.07 | 5.72 | — |
| 5 | 1000° C. × 2 h 1300° C. × 24 h | 1500° C. × 48 h | Absence | 1956 | 41.1 | 12.2 | 5.70 | 0 |
| 6 | 1000° C. × 2 h 1300° C. × 24 h | 1550° C. × 12 h | Absence | 2038 | 40.5 | 7.01 | 5.68 | — |
| 7 | 1000° C. × 2 h 1300° C. × 24 h | 1550° C. × 12 h | 1300° C. × 12 h | 2471 | 38.6 | −5.68 | 5.68 | 6.99 |
| 8 | 1300° C. × 24 h | 1550° C. × 100 h | Absence | 2229 | 40.7 | 3.06 | 5.75 | — |
| 9 | 1300° C. × 24 h | 1550° C. × 12 h | Absence | 2426 | 39.7 | −7.42 | 5.80 | 8.48 |
| 10 | 1300° C. × 24 h | 1550° C. × 12 h | 1300° C. × 12 h | 2380 | 39.2 | −9.01 | 5.80 | 8.80 |

0 referred to as "two step calcination"). The first calcination step was applied in an atmospheric air at a temperature of 1000° for 2 hours. The temperature elevation rate was 200° C./h and the temperature lowering rate was −200° C./h in this case.

The second calcination step conducted subsequent to the first calcination step was applied in an atmospheric air at a temperature of 1300° C. for 24 hours. The temperature elevation rate was 200° C./h, and the temperature lowering rate was −200° C./h in this case.

In Nos. 8 to 10 shown in the table, the calcination step was applied for a longer time than that in Test Example 1 (hereinafter referred to as "long time calcination"). In the cases, calcination was applied in an atmospheric air at a temperature of 1300° C. for 24 hours. The temperature elevation rate was 200° C./h and the temperature lowering rate was −200° C./h in this case.

Further, in Nos. 2, 7 and 10 shown in the table, the annealing treatment was applied after the sintering step.

The annealing step was applied in an atmospheric air at a temperature of 1300° C. for 12 hours. The temperature elevation rate was 100° C./h and the temperature lowering rate was −100° C./h in this case.

"S" shown in the table represents a numerical value that indicates an index for the regularity of the B site ingredient in each of the dielectric specimens. The numerical value is defined by the following equation.

$$S = \sqrt{\sqrt{(I_{100}/I_{110+102})}}$$

where "$I_{100}$" shows an integrated intensity of hexagonal system (100) regular lattice observed by XRD, while $I_{110,102}$ show (110) (102) integration intensity. The value for S is in the range of $7 \times 10^{-2}$ to $9 \times 10^{-2}$. Further, in a case if S is not regularized and $I_{100}$ can not be observed, it is defined as S=0.

In view of results described above, the value Qu increased by about 12–23% in Nos. 4 to 6 applied with two step calcination as compared with Nos. 1 and 3 applied only with a usual calcination step (one step calcination). This is because the reactivity between the A site ingredient and B side ingredient was improved by the application of the two step calcination.

Also in the case of Nos. 8 and 9 applied with the long time calcination, the value Qu increased by about 29 to 46% (or slightly greater), because regularization of the B site ingredient proceeded by application of the long time calcination.

The increasing rate for the value Qu was greater in a case of applying the long time calcination, because the regularization of the B site ingredient was promoted in the long time calcination due to high reactivity of the main ingredients, whereas the reaction of the main ingredient did not proceed well by the two step calcination conducted with an aim of making the reaction uniform between the A site ingredient and the B site ingredient.

Further, in No. 2 applied with the annealing treatment after the one step calcination, the value Qu increased by more than about 10% than in a case of No. 1 not applied with the annealing treatment.

Furthermore, in No. 7 applied with the annealing treatment after the two step calcination, the value Qu increased by about 22 to 27% as compared with Nos. 4 to 6 applied only with the two step calcination. This is because regularization of the B site ingredient was promoted by the annealing treatment (the value S which was zero increased up to $7 \times 10^{-2}$ to $9 \times 10^{-2}$, to form a super-lattice structure.

On the other hand, in No. 10 applied with the annealing treatment together with the long time calcination, the value Qu did not change so much as compared with Nos. 8 and 9 applied only with the long time calcination. This is probably because the value S was already high at the step before the annealing treatment ($8 \times 10^{-2}$ to $9 \times 10^{-2}$) and the value S increased no more even if the annealing treatment was applied.

Further, $\epsilon r$, $\tau f$ and sintering density show more preferred values by the improvement for the calcination step and the annealing treatment after sintering.

(ii) Test Example 4

In this test example, effects of presence or absence of the annealing treatment on the value Qu or the like upon manufacture of the dielectric specimens using the formulated powder containing $TiO_2$ were studied.

In this test example, dielectric specimens were prepared in the same Test Example 2 except for applying the annealing treatment after the sintering step (sintering temperature: 1550° C.).

Figure 9:
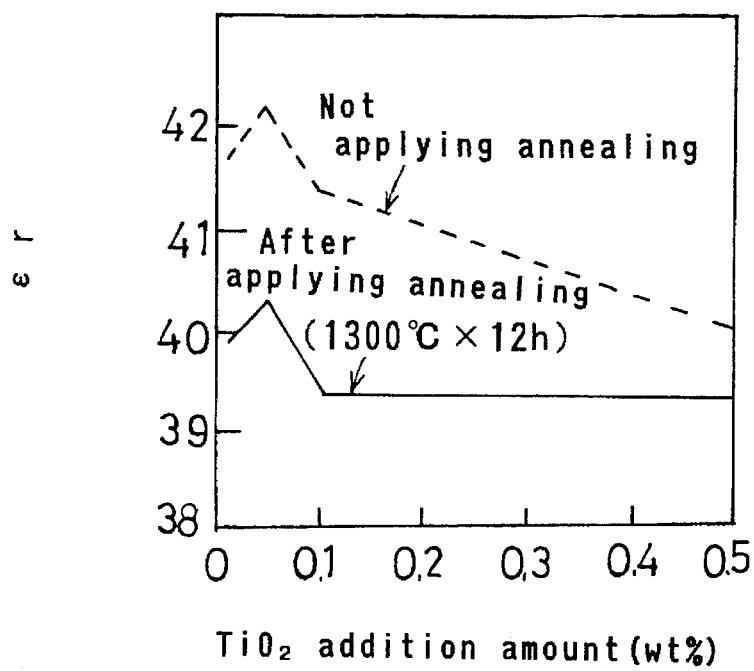
FIG. 9 is a graph showing a relationship between the addition amount of $TiO_2$ (at 0–0.5 wt %) and $\epsilon r$ (presence or absence of annealing treatment) for the ceramic composition shown in FIG. 5.
Figure 10:
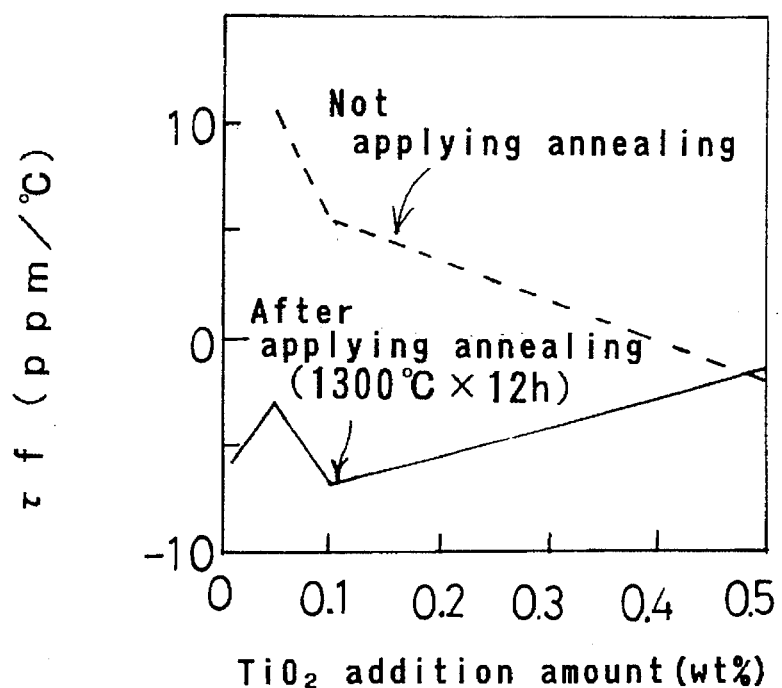
FIG. 10 is a graph showing a relationship between the addition amount of $TiO_2$ (at 0–0.5 wt %) and $\tau f$ (presence or absence of annealing treatment) for the ceramic composition shown in FIG. 5.

Measurement was conducted for the values $\epsilon r$, Qu and $\tau f$ also for the dielectric specimens prepared as described above and the results are shown in FIGS. 8 to 10. In the figures, test results concerning the dielectric specimens prepared under the same conditions as those in Test Example 2 were also shown together by dotted lines for comparison.

Figure 8:
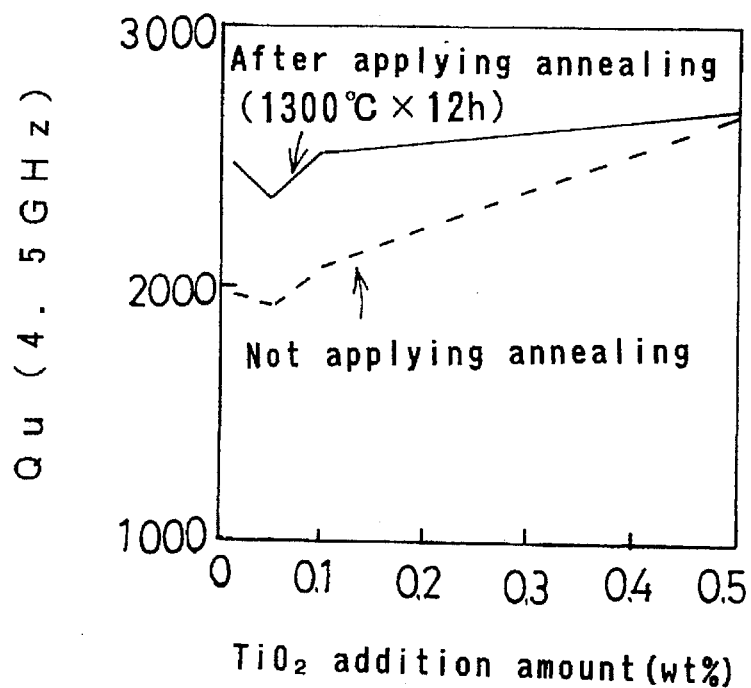
FIG. 8 is a graph showing a relationship between the addition amount of $TiO_2$ (at 0–0.5 wt %) and Qu (presence or absence of annealing treatment) for the ceramic composition shown in FIG. 5.

As shown in FIG. 8, the effect of the annealing treatment for increasing the value Qu is great in a case where the addition amount of $TiO_2$ is less than about 0.2% by weight.

Figure 11:
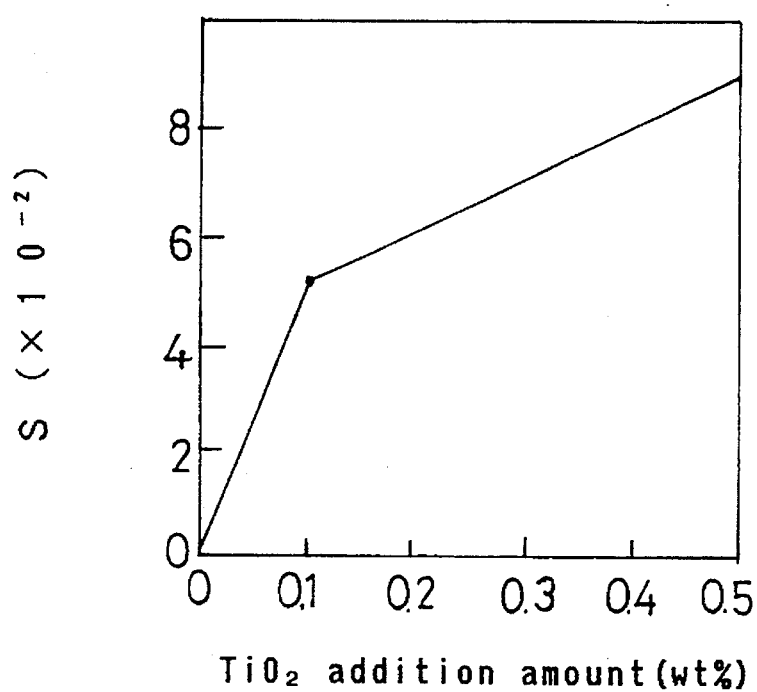
FIG. 11 is a graph showing a relationship between the addition amount of $TiO_2$ and degree of regularity (S)

However, as the addition amount of $TiO_2$ increases, the effect becomes smaller, and the values are substantially identical between the specimens with and without the annealing treatment at the addition amount of about 0.5% by weight. It is considered, as shown in FIG. 11, that no substantial effect can be obtained even by applying the annealing treatment in a case where the addition amount of $TiO_2$ is great and the value S is already high since the value S increases in proportion with the addition amount of $TiO_2$.

The values $\epsilon r$ shows a lower value as compared with the case of not applying the annealing treatment but can be said to be within an allowable range for each of the cases. Further, $\tau f$ shows a value around zero ppm/°C. which can be considered satisfactory.

The present invention is not restricted only to specific examples described above and embodiments modified variously are possible within the scope of the present invention in accordance with the purpose and the application use.

Namely though the sintering atmosphere was defined as "in air (atmospheric air)" in this example, it may be in "ZnO" atmosphere. Sintering in the ZnO atmosphere may be applied in a ZnO powder (for instance, sintering is conducted by incorporating a sufficient amount of a ZnO powder in a sintering sheath, burying the specimen, for example, of the cylindrical shape as described above before sintering into the powder and then applying sintering while putting a lid over the sintering sheath) or applied in a ZnO gas atmosphere (sintering is applied, for example, by incorporating an appropriate amount of a ZnO powder in a predetermined sintering sheath, placing a predetermined separator (Pt plate or the like) on the powder, then placing the specimen, for example, of the cylindrical shape as described above before sintering on the separator and then applying sintering while putting a lid over the sintering sheath).

Description will be made to a comparison test for examining the effects of the sintering atmosphere on the value Qu or the like of the dielectric specimen.

As shown in Table 2, in this test, (1) a formulated powder comprising a main ingredient represented by the compositional formula $Sr(Zn_{1/3}Nb_{2/3})O_3$ (hereinafter referred to as "powder A") and (2) a formulated powder comprising the main ingredient represented by the compositional formula $Ba(Zn_{1/3}Nb_{2/3})O_3$ (hereinafter referred to as "powder B") were provided. The powder B has the composition out of the scope of the present invention (X=0).

Then, using each of the formulated powders, dielectric specimens were prepared on each of sintering atmospheres of "in air" and "in ZnO gas atmosphere" described above. Other preparing conditions were the same as those in Test Example 1 excepting that "sintering temperature", "sintering time", "calcination temperature" and "calcination time" were as shown in Table 2.

Then, the value Qu or the like was measured on each of the dielectric specimens in the same manner as in Examples 1 and 2. The results are also shown in Table 2. Further, the crystal structures for each of the dielectric

TABLE 2

| Composition | $Sr(Zn_{1/3}Nb_{2/3})O_3$ (X = 1) | | $Ba(Zn_{1/3}Nb_{2/3})O_3$ (X = 0) | |
| --- | --- | --- | --- | --- |
| Sintering atmosphere | Air | ZnO gas | Air | ZnO gas |
| Sintering temp. (°C.) | 1550 | 1550 | 1550 | 1550 |
| Sintering time (h) | 48 | 96 | 24 | 96 |
| Calcination temp. (°C.) | 1200 | 1200 | 1200 | 1200 |
| Calcination time (h) | 2 | 2 | 2 | 2 |
| $\epsilon_r$ | 37.7 | 38.1 | 39.7 | 39.6 |
| Qu (4.5 GHz) | 2433 | 2654 | 1463 | 2653 |
| $\tau_f$ (ppm/°C.) | −24.5 | −25.2 | 35.6 | 47.70 |
| Sintering density (g/cm³) | 5.49 | 5.52 | 6.22 | 6.24 | specimens were analyzed by X-rays and the results are shown in FIGS. 12 to 15.

As shown in Table 2, the value Qu was improved more in the specimen sintered in the ZnO gas atmosphere for both of the specimens prepared from either the powder A or the powder B. The reason is considered as described below.

Figure 14:
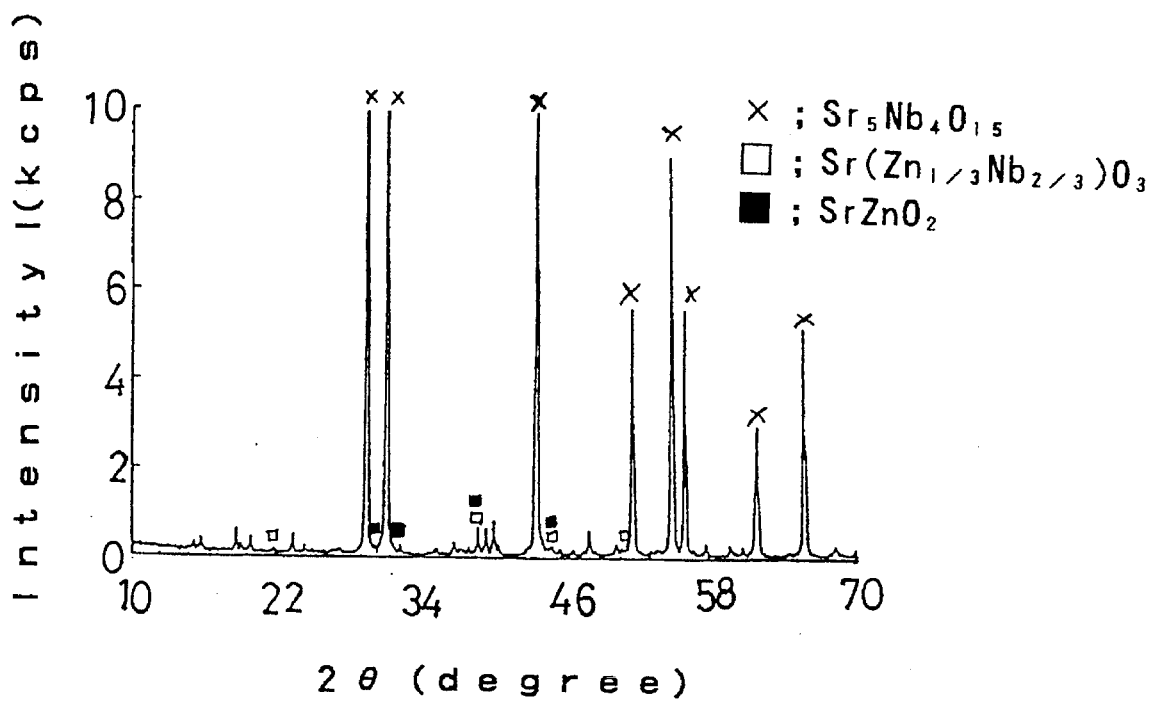
FIG. 14 is a graph showing a result for X-ray diffraction for a $Sr(Zn_{1/3}Nb_{2/3})O_3$ ceramic composition manufactured by sintering in atmospheric air.
Figure 15:
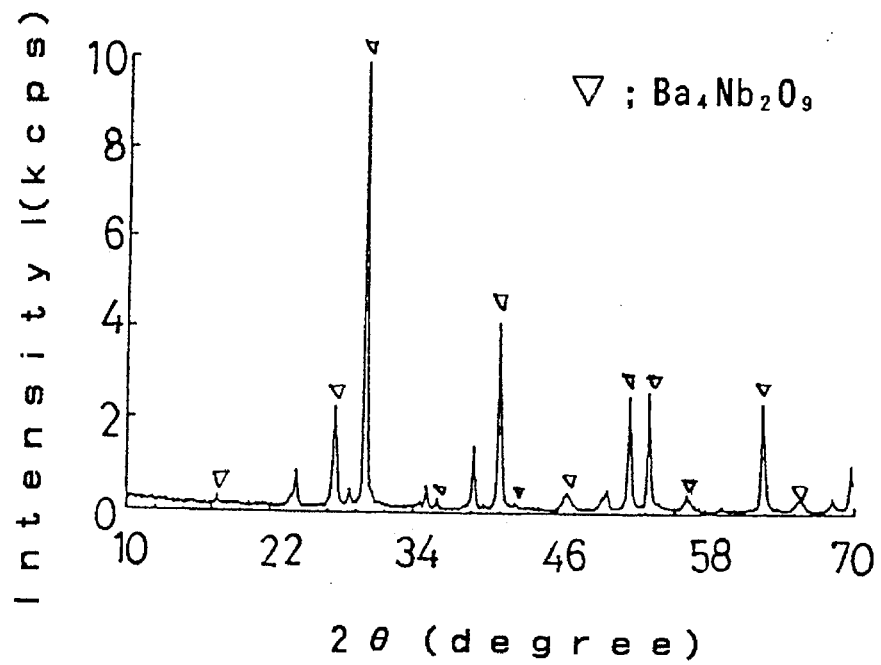
FIG. 15 is a graph showing a result for X-ray diffraction for a $Ba(Zn_{1/3}Nb_{2/3})O_3$ ceramic composition manufactured by sintering in atmospheric air.

Namely, for the specimens prepared by sintering air, a peak for $Sr_5Nb_4O_{15}$ appeared (in a case of the powder A) in a X-ray diffraction graph of FIG. 14, and a peak for $Ba_4Nb_2O_9$ appeared (in a case of the powder B) in s X-ray diffraction graph of FIG. 15, showing that a slight amount of by-products such as $Sr_5Nb_4O_{15}$ was formed on the surface of each of the specimens. Then, it is considered that the by-products hindered improvement for the value Qu.

Figure 12:
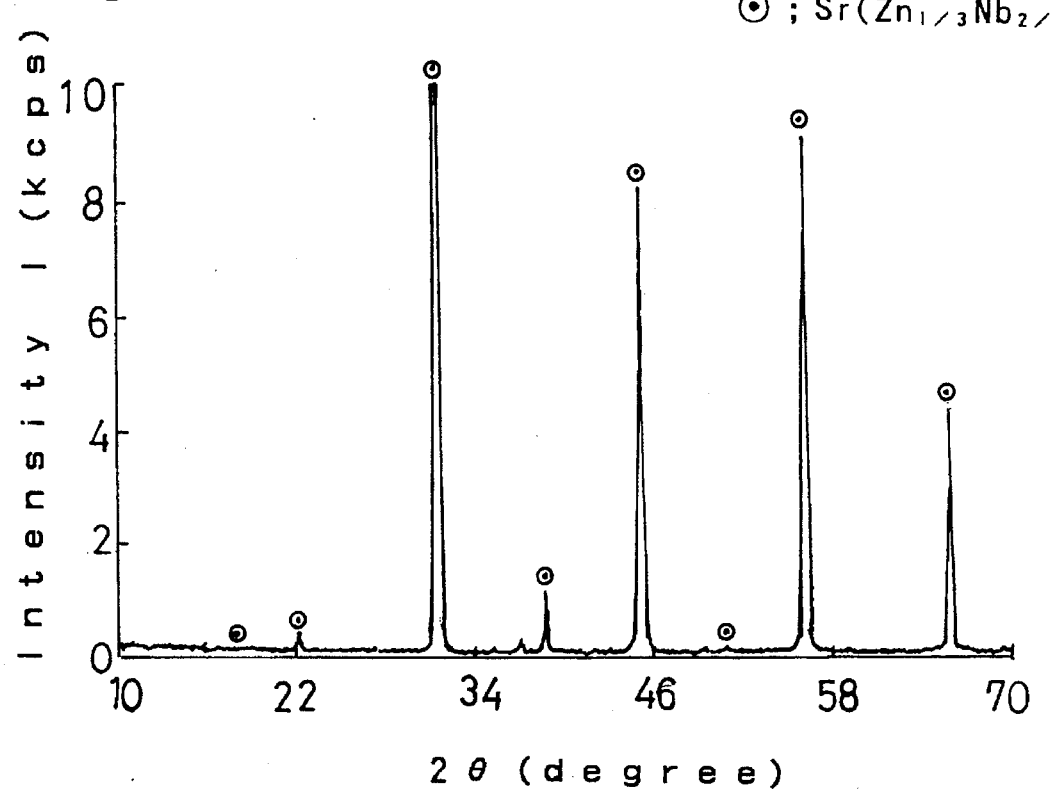
FIG. 12 is a graph showing a result for X-ray diffraction for a $Sr(Zn_{1/3}Nb_{2/3})O_3$ ceramic composition manufactured by sintering in a ZnO gas atmosphere.
Figure 13:
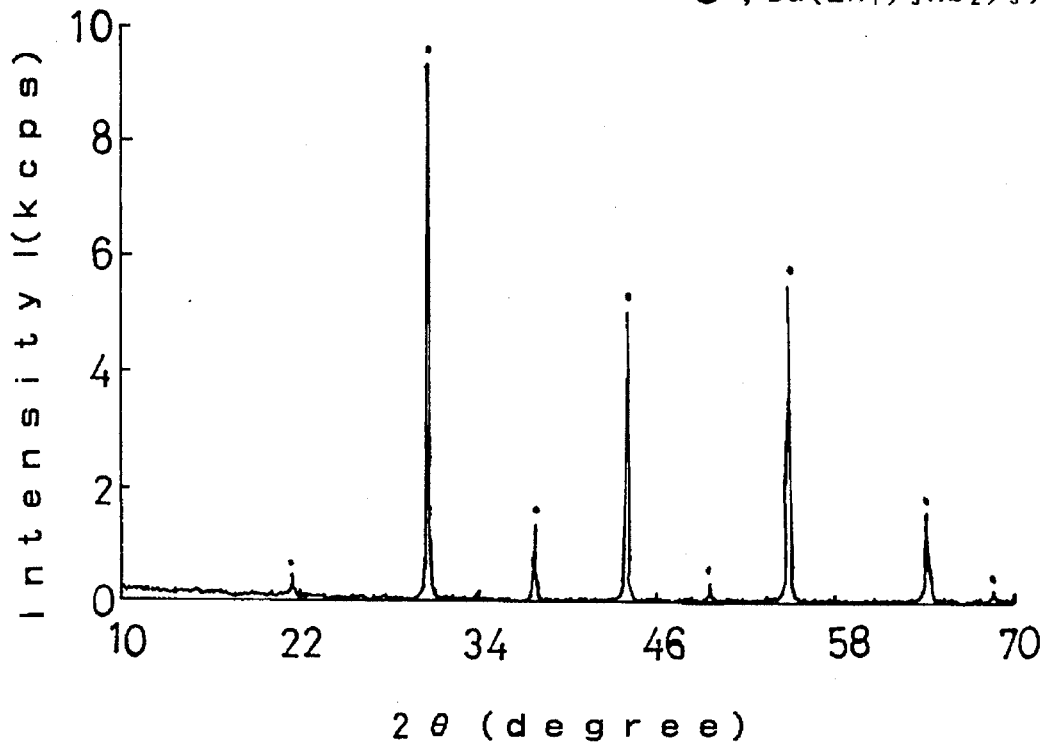
FIG. 13 is a graph showing a result for X-ray diffraction for a $Ba(Zn_{1/3}Nb_{2/3})O_3$ ceramic composition manufactured by sintering in a atmospheric air.

On the other hand, in the specimens prepared by sintering in the ZnO gas atmosphere, no peaks for $Sr_5Nb_5O_{15}$ (in a case of the powder A), etc were present in the X-ray diffraction graph of FIGS. 12 and 13 and it can be seen that no by-products as hindering the improvement of-the value Qu were formed on the surface of each of the specimens. It is considered that the value Qu increased remarkably as the result in the specimens described above.

Then, while the formation of the by-products as described above is caused by evaporation of ZnO in the course of the sintering, such evaporation can be prevented by conducting sintering in the ZnO gas atmosphere. From the foregoings, when the compositions as described previously in the examples are sintered in the ZnO atmosphere, the value Qu can be improved further to provide more satisfactory performance.

What is claimed is:

1. A microwave dielectric ceramic composition comprising a composition represented by $Ba_{1-x}Sr_x(Zn_{1/3}Nb_{2/3})O_3$ (in which $0.6 \leq x \leq 0.9$) as the main ingredient, to which $TiO_2$ is added and incorporated from 0.01 to 1 parts by weight based on 100 parts by weight of $Ba_{1-x}Sr_x(Zn_{1/3}Nb_{2/3})O_3$. $O_3$.

2. A microwave dielectric ceramic composition as defined in claim 1, wherein said x is within a range of 0.6 to 1.0, and said addition amount of $TiO_2$ is 0.3 to 0.5 parts by weight.

3. A microwave dielectric ceramic composition as defined in claim 2, which has a Qu value in the range of 2000 to 2900 (at 4.5 GHz), a relative dielectric constant in the range of 39 to 42, and a temperature coefficient of resonance frequency (τf) in the range of −8 to +10 ppm/°C.

4. A microwave dielectric ceramic composition as defined in claim 1 or 2, which does not contain $Si_5Nb_4O_{15}$, or $Si_5Nb_4O_{15}$ and $Ba_4Nb_2O_9$.

5. A microwave dielectric ceramic composition as defined in claim 1 or 2, having a parameter "S" which has a numerical value that indicates an index for the regularity of a B site ingredient and is in the range of $7 \times 10^{-2}$ to $9 \times 10^{-2}$.

said "S" is defined by the following equation:

$$S = \sqrt{(I_{100}/I_{110+102})}$$

where "$I_{100}$" shows an integrated intensity of the hexagonal system (100) regular lattice observed by XRD, while $I_{110, 102}$ show (110) (102) integration intensity respectively, and $I_{110+102}$ is the total of the (110) and (102) integration intensities.

6. A method of preparing a microwave dielectric ceramic composition comprising a composition represented by $Ba_{1-x}Sr_x(Zn_{1/3}Nb_{2/3})O_3$ (in which $0.6 \leq x \leq 0.9$) as the main ingredient, to which $TiO_2$ is added and incorporated from 0.01 to 1 parts by weight based on 100 parts by weight of $Ba_{1-x}Sr_x((Zn_{1/3}Nb_{2/3})O_3$, which comprises applying calcination for two steps and, subsequently, applying sintering to said composition.

7. A method of preparing a microwave dielectric ceramic composition as defined in claim 6, wherein said microwave dielectric ceramic composition having a parameter "S" which has a numerical value that indicates the index for regularity of a B site ingredient and is in the range of $7 \times 10^{-2}$ to $9 \times 10^{-2}$:

said "S" is defined by the equation $$S = \sqrt{(I_{100}/I_{110+102})}$$

where "$I_{100}$" shows an integrated intensity of the hexagonal system (100) regular lattice observed by XRD, while $I_{110, 102}$ show (110) (102) integration intensity respectively, and intensities.

8. A method of preparing a microwave dielectric ceramic composition as defined in claim 6 or 1, wherein the first calcination temperature is 950° to 1050° C., and the second calcination temperature is 1250° to 1350° C.

9. A method of preparing a microwave dielectric ceramic composition comprising a composition represented by $Ba_{1-x}Sr_x(Zn_{1/3}Nb_{2/3})O_3$ (in which $0.6 \leq x \leq 1.0$) as the main ingredient, to which $TiO_2$ is added and incorporated from 0.01 to 1 parts by weight based on 100 parts by weight of $Ba_{1-x}Sr_x(Zn_{1/3}Nb_{2/3})O_3$, which comprises applying calcination for two steps and, subsequently, applying sintering to said composition, wherein the calcination atmosphere and sintering atmosphere is a ZnO atmosphere.

10. The method of claim 9 further comprising applying an annealing treatment to said composition after sintering.

11. A method of preparing a microwave dielectric ceramic composition comprising a composition represented by $Ba_{1-x}Sr_x(Zn_{1/3}Nb_{2/3})O_3$ (in which $0.6 \leq x \leq 0.9$) as the main ingredient, to which $TiO_2$ is added and incorporated from 0.01 to 1 parts by weight based on 100 parts by weight of $Ba_{1-x}Sr_x(Zn_{1/3}Nb_{2/3})O_3$, which comprises applying calcination for more than 15 hours and, subsequently, applying sintering to said composition.

12. A method of preparing a microwave dielectric ceramic composition as defined in claim 11 wherein said microwave dielectric ceramic composition having a parameter "S" which has a numerical value that indicates the index for regularity of a B site ingredient and is in the range of $7 \times 10^{-2}$ to $9 \times 10^{-2}$:

said "S" is defined by the equation $$S = \sqrt{(I_{100}/I_{110+102})}$$

where "$I_{100}$" shows an integrated intensity of the hexagonal system (100) regular lattice observed by XRD, while $I_{100, 102}$ show (110) (102) integration intensity respectively, and $I_{110+102}$ is the total of the (110) and (102) integration intensities.

13. A method of preparing a microwave dielectric ceramic composition comprising a composition represented by $Ba_{1-x}Sr_x(Zn_{1/3}Nb_{2/3})O_3$ (in which $0.6 \leq x \leq 1.0$) as the main ingredient, to which $TiO_2$ is added and incorporated from 0.01 to 1 parts by weight based on 100 parts by weight of $Ba_{1-x}Sr_x(Zn_{1/3}Nb_{2/3})O_3$, which comprises applying calcination for more than 15 hours and, subsequently, applying sintering to said composition, wherein the calcination atmosphere and the sintering atmosphere is a ZnO atmosphere.

14. The method of claim 13 further comprising applying an annealing treatment to said composition after sintering.

15. A method of preparing a microwave dielectric ceramic composition as defined in claim 11 or 13, wherein the calcination temperature is 1250° to 1350° C., and the calcination time is 20 to 30 hours.

16. A method of preparing a microwave dielectric ceramic composition as defined in claim 6 or 11, which comprises applying an annealing treatment to said composition after sintering.

17. A method of preparing a microwave dielectric ceramic composition as defined in claim 16, wherein said microwave dielectric ceramic composition having a parameter "S" which has a numerical value that indicates the index for regularity of a B site ingredient and is in the range of $7 \times 10^{-2}$ to $9 \times 10^{-2}$:

said "S" is defined by the equation $$S = \sqrt{(I_{100}/I_{110+102})}$$

where "$I_{100}$" shows an integrated intensity of the hexagonal system (100) regular lattice observed by XRD, while $I_{110}$, $I_{102}$ show (110) (102) integration intensity respectively, and $I_{110+102}$ is the total of the (110) and (102) integration intensities.

18. A method of preparing a microwave dielectric ceramic composition as defined in claim 10 or 14, wherein the annealing temperature is 1250° to 1350° C., and the annealing time is 10 to 14 hours.

* * * * *

UNITED STATES PATENT AND TRADEMARK OFFICE
CERTIFICATE OF CORRECTION

PATENT NO. : 5,457,076

DATED : October 10, 1995

INVENTOR(S) : KATAGIRI et al.

It is certified that error appears in the above-indentified patent and that said Letters Patent is hereby corrected as shown below:

Claim 1, col. 9, line 32, "parts" should read --part--;

line 33, delete "03.".

Claim 7, col. 10, line 12, after "and" insert --$I_{110+102}$ is the total of the (110) and (102) integration--.

Claim 8, col. 10, line 13, "claim 6 or 1" should read --claim 6 or 9--.

Signed and Sealed this

Fifth Day of December, 1995

Attest:

BRUCE LEHMAN

*Attesting Officer*     *Commissioner of Patents and Trademarks*